(12) United States Patent
Hui

(10) Patent No.: US 8,836,012 B2
(45) Date of Patent: Sep. 16, 2014

(54) SPACER DESIGN TO PREVENT TRAPPED ELECTRONS

(71) Applicant: Spansion LLC, Sunnyvale, CA (US)

(72) Inventor: Angela T. Hui, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/644,901

(22) Filed: Oct. 4, 2012

(65) Prior Publication Data

US 2014/0097497 A1 Apr. 10, 2014

(51) Int. Cl.
*H01L 29/792* (2006.01)

(52) U.S. Cl.
USPC ........... 257/324; 257/314; 257/315; 257/316; 257/E21.159

(58) Field of Classification Search
CPC .................... H01L 21/11524; H01L 21/11568
USPC ........... 257/314–315, 324; 438/257–258, 593
See application file for complete search history.

(56) References Cited

U.S. PATENT DOCUMENTS

| 6,894,341 | B2 * | 5/2005 | Sugimae et al. | 257/315 |
|---|---|---|---|---|
| 7,619,927 | B2 | 11/2009 | Cho | |
| 8,263,458 | B2 | 9/2012 | Chen et al. | |
| 2004/0061169 | A1 | 4/2004 | Leam et al. | |
| 2005/0087892 | A1 | 4/2005 | Hsu et al. | |
| 2007/0034932 | A1 * | 2/2007 | Kim | 257/314 |
| 2012/0142175 | A1 * | 6/2012 | Hui et al. | 438/514 |

FOREIGN PATENT DOCUMENTS

KR 10-2006-0007177 A 1/2006
KR 10-0851915 B1 8/2008

OTHER PUBLICATIONS

International Search Report and Written Opinion of the International Searching Authority for International Application No. PCT/US2013/063089, mailed Jan. 2, 2014.

* cited by examiner

*Primary Examiner* — Dung A. Le
(74) *Attorney, Agent, or Firm* — Sterne, Kessler, Goldstein & Fox P.L.L.C.

(57) ABSTRACT

Charge-trapping field effect transistors may be formed into an array on a wafer suitable to be a NAND memory device. A thick oxide layer is applied over the gates to ensure that the gap between the gates is filled. The filled gap substantially prevents nitride from being trapped, which could otherwise decrease the yield of the devices. This technique, and its variations, are useful for a range of semiconductor devices.

6 Claims, 3 Drawing Sheets

SPACER DESIGN TO PREVENT TRAPPED ELECTRONS

BACKGROUND

1. Field of the Invention

This invention relates generally to spacer fabrication, and is well suited to forming spacers in a NAND flash memory array.

2. Background Art

The semiconductor market has been undergoing extensive growth over the past few decades. This trend is expected to continue for the foreseeable future since a large portion of this market is the memory segment. The memory segment can be broadly categorized into two classes, namely volatile memory and non-volatile memory. Volatile memory such as SRAM and DRAM lose their data content when the power supply is removed. In contrast, non-volatile memories such as EEPROM and flash memories maintain their data content after the power supply has been removed.

Non-volatile memories offer particular advantages, and thereby support a wide range of applications including computer, automotive and consumer electronic devices. Flash memory is a non-volatile memory that can be electrically erased and reprogrammed. In fact, flash memory has undergone an explosive market growth that has in particular been driven by cellular telephones, memory cards, flash drives and other types of portable data storage devices. Indeed, with the need to support persistent data storage in portable devices, it is clear that the flash memory will continue to grow at an ever increasing rate. Further, the market place will demand flash memory designs that support lower cost and higher performance, including higher densities of storage.

An ongoing barrier to reducing cost, improving performance and storage density is yield of the devices. Semiconductor devices are manufactured on wafers (currently 300 mm discs of silicon, which are expected to increase to 450 mm discs in the near future). The wafers are divided into a rectangular grid, and semiconductor devices are fabricated in the rectangles. After fabrication, the devices are tested. If a device fails, it will not be sold to consumers, thus reducing profit for the manufacturer or increasing cost to the consumer. However, if more and more devices are manufactured without errors or defects, more aggressive designs may be pursued, which can provide customers with devices that have higher performance and higher densities.

Improving yield remains an elusive goal.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
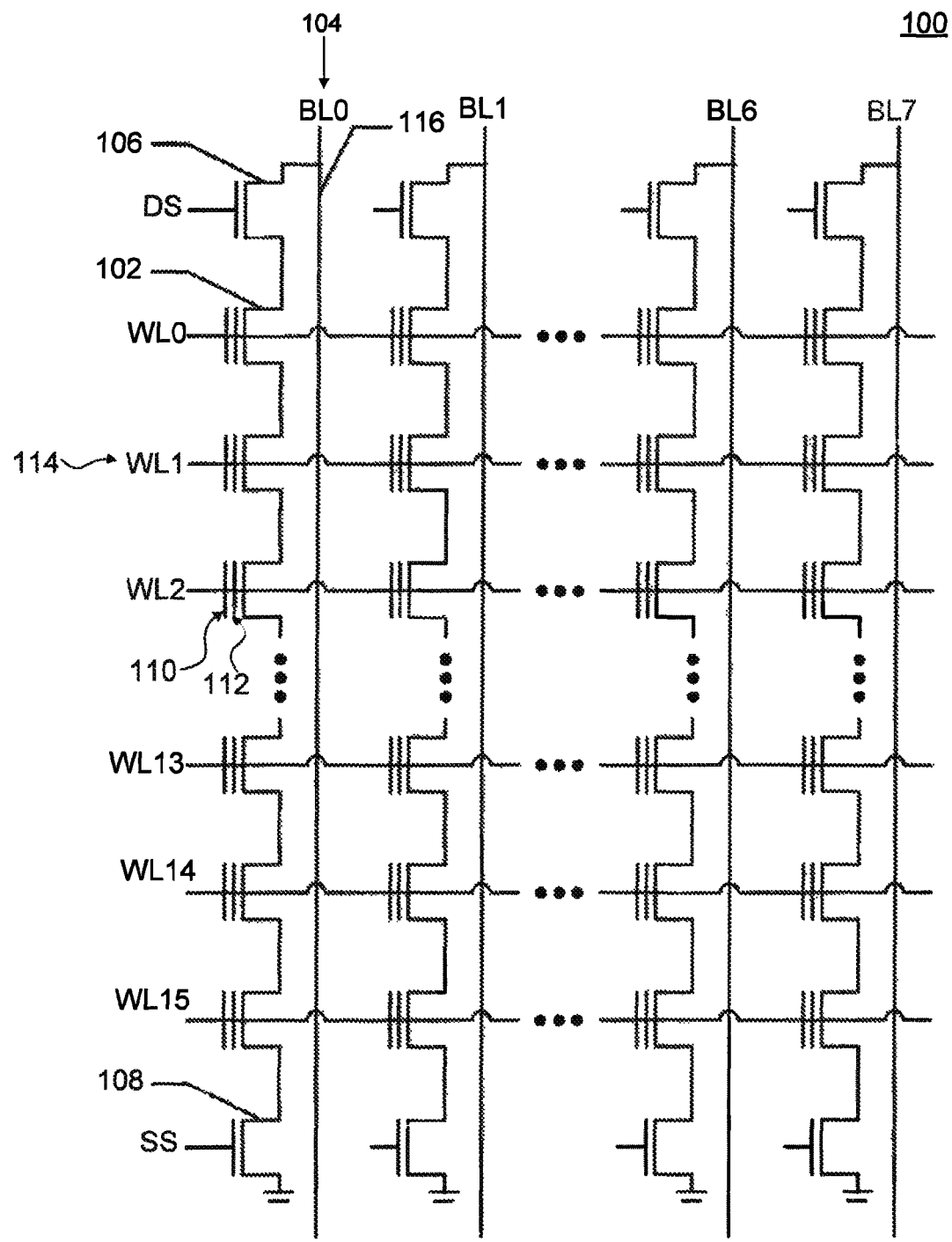
FIG. 1 is a schematic illustration of a memory array.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Currently, intense global competition in the semiconductor manufacturing space, particularly for NAND flash memory, means that improvements in yield can be quite valuable. To a lesser extent, reducing the number of operations required to manufacture a wafer of NAND memories can also lead to a competitive advantage.

An issue can arise when nitride gets trapped in oxide spacers. Trapped nitride can lead to defects in volume production because the trapped nitride changes the conductivity of the spacer oxide, which is designed to serve as an insulator. In particular, nitride in a spacer could trap electrons during erase and cause string current reduction. Either of these defects could cause a NAND memory to fail a quality control check, leading to a need to dispose of that NAND memory and possibly the entire wafer.

Therefore, what is needed is new techniques to manufacture semiconductors to prevent trapped nitride.

According to an embodiment of the present invention, there is provided a semiconductor device comprising first, second and third gates on a substrate. A first portion of oxide fills a region between the first gate and the second gate, such that the oxide reaches from the substrate up to at least almost a top of at least one of the first gate and the second gate. A second portion of oxide forms a drain adjacent to the third gate. The second portion of oxide and the third gate have a width large enough to meet a minimum feature size and the first portion of oxide is narrower than the minimum feature size.

According to another embodiment of the present invention, there is provided a method of manufacturing a semiconductor device, by forming first, second and third gates on a substrate, depositing oxide over the first, second and third gates, a first etching of the oxide that does not substantially etch oxide below tops of the first and second gates, a second etching of a region of oxide adjacent to the third gate that etches to the substrate, and forming a drain in the region of oxide adjacent to the third gate. The oxide between the first gate and the second gate is narrower than a critical dimension. The region of oxide adjacent to the third gate and the third gate are wider than a critical dimension.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

FIG. 1 depicts a transistor level schematic of a memory array 100. Memory array 100 comprises an array of Field Effect Transistors (FET) 102. FET 102 is capable of storing charge corresponding to a '1' or '0', and thus an array of FETs 102 may be used to form an array of memory cells, such as a NAND flash memory. NAND memories at sizes such as 8 GB, 16 GB or 32 GB are commercially available. GB stands for gigabyte, which for mass storage is generally understood to be one billion bytes, with eight bits to the byte. In some cases, GB refers to 1024^3 bytes, or about 1.07 billion bytes. An array of FETs 102 may therefore be a two by four array, or a multibillion device array. A memory array 100 may be other sizes in addition to these. Each column 104 of FETs 102 has a drain select transistor 106 at one end and a source select transistor 108 at the other end.

In one embodiment, drain select transistor 106, source select transistor 108, or both may be a Metal Oxide Semiconductor Field Effect Transistor (MOSFET). Operation of such MOSFETs is well known and not discussed herein.

In one embodiment, FETs 102 between drain select (DS) transistor 106 and source select (SS) transistor 108 may be Charge-Trapping (CT) FETs. In this example, NAND flash memory 100 may also be referred to as a CT-NAND flash memory. A CT-FET 102 is formed with two gates, with one of the gates on top of the other (which could also be described as one gate with two layers), as opposed to standard FETs that have a single gate. The first or top gate 110 on CT-FET 102 is a control gate, which is the same type of gate as is found on selecting transistors 106 and 108. The second or bottom gate 112 is a floating gate, which is often surrounded by an insulating layer. A floating gate type allows a CT-FET 102 to store charge after the device has been powered off due to the insulation. Therefore, CT-FETs 102 may be used to build non-volatile memory.

In an embodiment, NAND flash memory 100 also includes Word-Lines (WL) 114. WL 114 addresses FETs 102 in a given row. For example, WL 114 can activate FETs 102 when NAND technology addresses groups of FETs 102. The column of CT-FETs 102 is also connected to a bit line (BL) 116.

In some instances, spacer nitride can become trapped in spacer oxide between CT-FETs 102 during manufacturing. Trapped nitride can lead to defects in a NAND memory 100 because nitride adjacent to a word-line gate, such as WL0, can trap electrons during an erase cycle and cause string current reduction. These issues may cause a NAND memory device 100 to fail inspection, thus leading to problems in volume production. Embodiments of the present invention fill gaps between CT-FETs 102 with silicon dioxide, which substantially eliminates the ability for nitride to become trapped, thus alleviating the concern over production defects. It is to be appreciated that the gap filling can be used for other devices aside from NAND memory 100.

Figure 2:
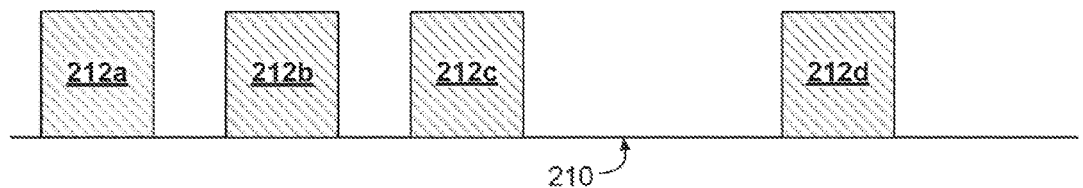
FIG. 2 is a side view of a wafer undergoing fabrication.
Figure 3:
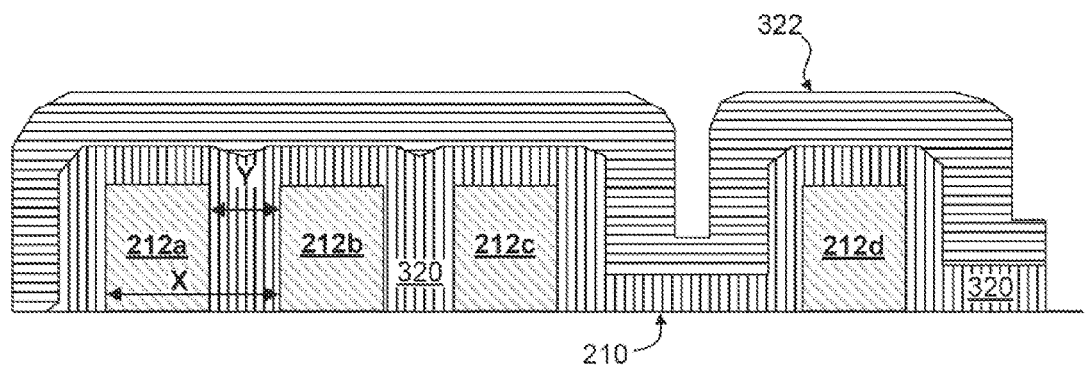
FIG. 3 is a side view of the wafer of FIG. 2 at a later stage of fabrication.
Figure 4:
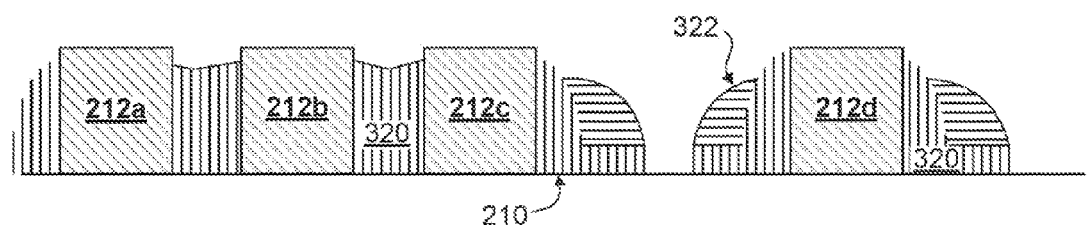
FIG. 4 is a side view of the wafer of FIG. 3 at a later stage of fabrication.

FIGS. 2, 3, and 4 depict side-views of a substrate 210 during various stages of fabrication, according to an embodiment of the present invention. Reference is made through the rest of the description interchangeably between FIGS. 2, 3, and 4. For example, substrate 210 represents a portion of a NAND logic device, e.g., NAND 100 in FIG. 1, during fabrication to substantially eliminate gaps between CT-FETs 102 and thus eliminate trapped nitride.

FIG. 2 depicts substrate 210 with gates 212 during a first stage of fabrication. In one example, substrate 210 may be part of a 300 mm or 450 mm wafer, which may be 0.75 mm thick. As shown, substrate 210 may form a layer onto which electronic devices (e.g., gates 212) may be created. Substrate 210 may be manufactured from silicon, silicon dioxide, aluminum oxide, sapphire, germanium, gallium arsenide (GaAs), an alloy of silicon and germanium, or indium phosphide (InP) or other suitable material. In some cases (not shown), a substrate 210 may comprise an insulator with a layer of semiconductor on top of the insulator.

In one example, deposition of gate 212 may occur through physical vapor deposition (PVD), chemical vapor deposition (CVD), electrochemical deposition (ECD), molecular beam epitaxy (MBE) or atomic layer deposition (ALD), or other techniques for creating semiconductor features on a substrate.

In one example, gates 212 may be manufactured into FETs 102 shown in FIG. 1. In another example, gates 212a-c may become word-lines 114 and gate 212d may become a peripheral gate, such as drain select transistor 106 or source select transistor 108, or both.

In one example, gates 212 may be manufactured from a variety of materials, e.g., good conductors. Candidates include, but are not limited to, highly doped polycrystalline silicon, silicide (e.g., the highly doped polycrystalline silicon's top layers are alloyed with at least one of tungsten, titanium, cobalt, and nickel). For very scaled down designs, a metal gate, such as one made from tantalum, tungsten, tantalum nitride, or titanium nitride may be used, possibly with a high-k dielectric.

FIG. 3 depicts a subsequent stage of fabrication of substrate 210. For example, in this stage a first layer 320 is formed over substrate 210 and gates 212 and a second layer 322 is formed over first layer 320. In one example, first layer 320 and substrate 210 entirely surround gate 212, such that when second layer 322 is deposited, there is very little possibility that second layer 322 will come into contact with the gate 212 or become trapped in a space occupied by the first layer 320.

First layer 320 may be a gate dielectric, for example silicon dioxide (sometimes referred to as a "gate oxide" or "oxide"). In certain embodiments, alternative materials with a higher dielectric constant may be used. One way to produce a layer of silicon dioxide is thermal oxidation, where an oxidizing agent is diffused into a wafer containing silicon at a high temperature to form silicon dioxide through the resulting reaction.

First layer 320 may be thick enough to fill in any gaps between word-line gates 212a-c, i.e., first layer 320 does not leave behind a valley as exists between gates 212c and 212d. In one example, first layer 320 may be about 150-500 or 300-500 angstroms thick.

The term "portion of oxide" is intended to be a broad term. A portion of oxide might be a region of a larger oxide, such as the oxide 320 between gate 212a and gate 212b, or as between gate 212b and gate 212c. A portion of oxide might be an entire layer of oxide, such as first layer 320. A portion of oxide might be a discrete amount of oxide, as depicted in FIG. 4.

In one example, second layer 322 may be a nitride layer. In one embodiment, second layer 322 may be a silicon-rich nitride having an atomic ratio of silicon to nitrogen that is about 3:4 or greater. A nitride layer may function as a dielectric, and may work in conjunction with first layer 320 in this capacity. A nitride layer may be deposited at high temperatures in a LPCVD reactor or be plasma-enhanced in a PECVD system. In some embodiments, certain combinations of silicon, nitrogen and hydrogen (i.e., $SiN_xH_y$) may be included in a second layer 322. In some embodiments, a nitride layer may consist of a layer of nitride above a layer of silicon-rich nitride.

In certain embodiments, second layer 322 of silicon nitride may be used to form a lightly doped drain (LDD) spacer in conjunction with a silicon dioxide layer as a first layer 320. One example of a LDD is a drain region with reduced doping in FETs 102 (FIG. 1) with very small geometries. A LDD may be used to control breakdown between the drain and substrate because a lowered doping gradient between drain and channel will lower the electric field in the channel in the vicinity of the drain. One way to implement a LDD is to deposit a first, moderate implant, followed by deposition and etching of a LDD spacer, then deposition of a second, heavy implant.

In such embodiments, second layer 322 may be thick enough that, after etching, the LDD spacer will be at least as wide as a Critical Dimension (CD), also referred to as a target CD requirement. A critical dimension may also be referred to as a minimum feature size or target design rule. Presently, all types of electromagnetic radiation can be used, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams. In one example, deep ultra-violet light can be used to produce wavelengths of about 248 and 193 nm, which provides for a critical dimension of about 50 nm.

In one embodiment, as shown in FIG. 3 there may be a distance X between sides of adjacent gates 212. Additionally, in one example X is about 86 nanometers. There may be a distance Y between gates 212a and 212b, and similarly between gates 212b and 212c. Additionally, distance Y may be between about 30 to 40 nanometers.

FIG. 4 shows a further subsequent stage of fabrication, for example a stage after the embodiment shown in FIG. 3 and after at least one etching step. For example, in a wet etch process, silicon dioxide may be etched with hydrofluoric acid (HF), or with a buffered oxide etch, such as ammonium fluoride ($NH_4F$) and hydrofluoric acid (HF). A wet etch process for silicon nitride may use 85% Phosphoric acid ($H_3PO_4$). In another example, during a dry etch process, also known as plasma etching, either silicon dioxide or silicon nitride may be etched with $CF_4$, $SF_6$ and $NF_3$.

In one embodiment, a top nitride layer 322 is etched down to an oxide layer 320. An oxide spacer (i.e., the oxide layer between a periphery gate 212d and the nearest word-line gate 212c) may then be etched, such that the etching stops at the silicon substrate 212. In this manner, the core spacer (e.g., the oxide 320 between gates 212a and 212b) will remain as all oxide, and periphery gate 212d will have the desired critical dimension width for a lightly doped drain implant. In one example, this approach may prevent nitride from becoming trapped in the space between the word-line gates 212a-c.

Figure 5:
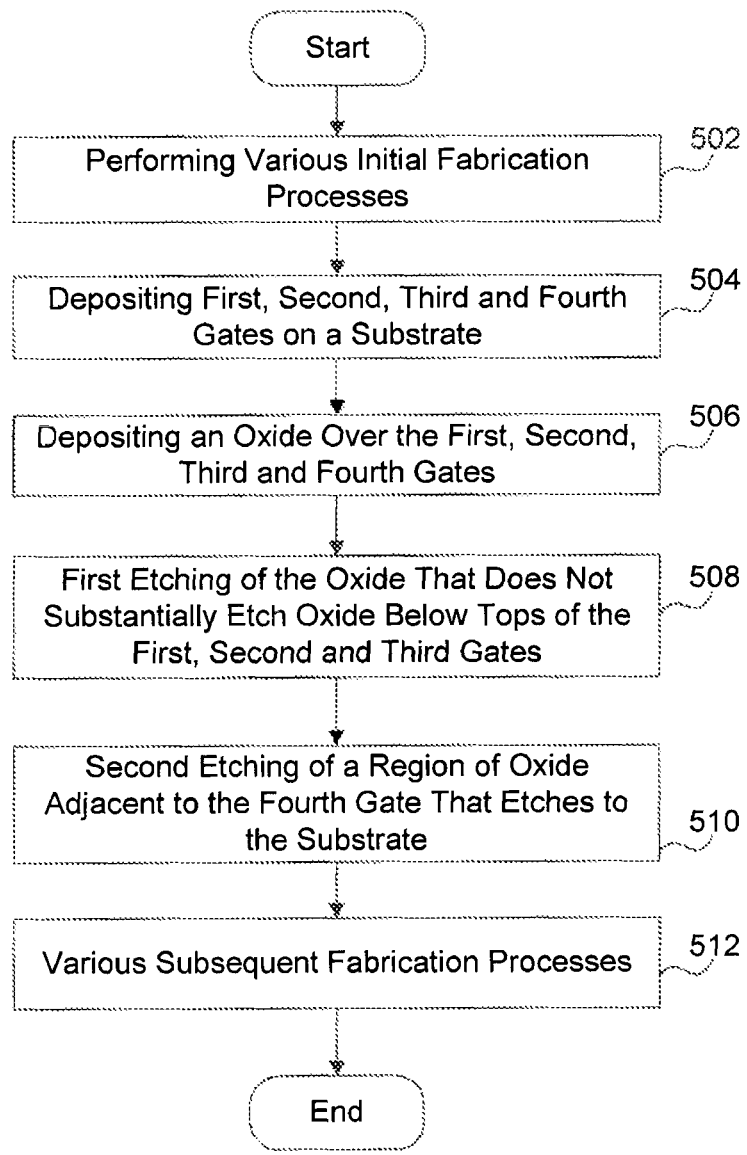
FIG. 5 is a flow chart of a method for fabricating a spacer.

FIG. 5 is a flowchart depicting a method 500 for manufacturing a semiconductor 500, according to one embodiment of the present invention. In one example, method 500 may be used to from the fabrication stages shown in FIGS. 2, 3, and 4 to produce a NAND memory show in FIG. 1. It is to be appreciated that not all steps discussed below may be required, or be required to be performed in the order described.

In step 502, various initial fabrication processes are performed. Such processes 502 may include creating a substrate on a silicon wafer.

In step 504, first, second, third and fourth gates are deposited or formed on a substrate. The first second and third gates may be used to form a NAND memory array, e.g., gates 212a-c of array 100. The fourth gate may be a peripheral gate (e.g., gate 212d) which may eventually become a selection transistor (e.g., drain transistor 106 or source transistor 108).

All four gates may be made from polysilicon. In one embodiment, the gates may be placed periodically, e.g., one every 86 nanometers, such that there are about 30-40 nanometers between the gates.

In step 506, an oxide is deposited over the first, second, third and fourth gates. In one embodiment, a thick layer of oxide, e.g., about 150-500 or 300-500 angstroms thick, may be deposited. In another embodiment, the oxide layer may be as thick as the gap between consecutive CT-FETs 102 is wide (e.g., the gap between gates 212a and 212b). In another embodiment, the oxide layer may be as thick as half the period of gate placement, e.g., about 86 nm/2, which is about 430 angstroms.

In step 508, the oxide layer is etched, but the etching does not substantially etch oxide below tops of the first, second and third gates. As described with reference to FIG. 4, this may occur with a dry etching of a top nitride spacer 322 down to an oxide spacer 320.

In step 510, a region of oxide adjacent to the fourth gate is etched to the substrate. As described with reference to FIG. 4, this may be a dry etching that etches an oxide spacer 320 and stops on a silicon substrate 212.

In step 512, various subsequent fabrication processes are performed. These may include creating a drain from oxide next to the fourth gate (e.g. gate 212d), lightly doping the drain, and fabricating a selection transistor (e.g., drain transistor 106 or source transistor 108). Similarly, the various subsequent fabrication processes may include fabricating the first, second and third gates (e.g., gate 212a-c) into CT-FETs 102 and fabricating a NAND memory array 100 from the CT-FETs 102. Additional examples may be found in co-owned U.S. patent application Ser. No. 12/973,631, filed Dec. 10, 2010, which is hereby incorporated by reference in its entirety for its teachings regarding fabrication, but not necessarily for definitional purposes.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the current invention. Therefore, such adaptations and modifications are intended to be within the meaning and range of equivalents of the disclosed embodiments, based on the teaching and guidance presented herein. For example, the specification uses nanoscale measurements and one of ordinary skill in the art will appreciate that these should be interpreted in light of the relevant manufacturing or measuring tolerances. It is to be understood that the phraseology or terminology herein is for the purpose of description and not of limitation, such that the terminology or phraseology of the present specification is to be interpreted by the skilled artisan in light of the teachings and guidance.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device, comprising:
   a substrate;
   first, second and third gates on the substrate;
   a first portion of oxide filling a region between the first gate and the second gate, such that the oxide reaches from the substrate up to at least almost a top of at least one of the first gate and the second gate; and
   a second portion of oxide forming a drain adjacent to the third gate,
   wherein the second portion of oxide and the third gate have a width large enough to meet a minimum feature size and the first portion of oxide is narrower than the minimum feature size, and
   wherein the first portion of oxide is about 30 to 40 nanometers thick.

2. The semiconductor device of claim 1, wherein the semiconductor device comprises a charge-trapping field effect transistor.

3. The semiconductor device of claim 1, wherein the semiconductor device comprises NAND memory.

4. The semiconductor device of claim 1, wherein the drain is a lightly doped drain.

5. The semiconductor device of claim 1, wherein the third gate is part of a selection transistor.

6. The semiconductor device of claim 1, wherein the first and second gates are part of an array.

* * * * *